(12) United States Patent
Nakamura et al.

(10) Patent No.: US 6,791,810 B2
(45) Date of Patent: Sep. 14, 2004

(54) PROTECTION CIRCUIT OF FIELD EFFECT TRANSISTOR AND SEMICONDUCTOR DEVICE

(75) Inventors: Mitsuhiro Nakamura, Tokyo (JP); Shinichi Wada, Kanagawa (JP)

(73) Assignee: Sony Corporation, Tokyo (JP)

( * ) Notice: Subject to any disclaimer, the term of this patent is extended or adjusted under 35 U.S.C. 154(b) by 191 days.

(21) Appl. No.: 09/862,894

(22) Filed: May 22, 2001

(65) Prior Publication Data

US 2002/0018328 A1 Feb. 14, 2002

(30) Foreign Application Priority Data

May 22, 2000 (JP) .................................... P2000-150350
Mar. 28, 2001 (JP) .................................... P2001-091916

(51) Int. Cl.[7] ............................ H02H 3/20; H02H 9/04
(52) U.S. Cl. ................................... 361/91.5; 361/91.1
(58) Field of Search .......................... 361/91.5, 91.1; 257/355

(56) References Cited

U.S. PATENT DOCUMENTS 4,760,434 A * 7/1988 Tsuzuki et al. ............... 257/49
6,156,581 A * 12/2000 Vaudo et al. ................. 438/22
6,433,985 B1 * 8/2002 Voldman et al. ............ 361/113

* cited by examiner

*Primary Examiner*—Gregory J. Toatley, Jr.
*Assistant Examiner*—Z Kitov
(74) *Attorney, Agent, or Firm*—Robert J. Depke; Holland & Knight LLP

(57) ABSTRACT

There is provided a protection circuit of a field effect transistor having a structure which can be fabricated without restricting a pattern layout and without increasing a process step. A protection circuit of a field effect transistor is a protection circuit of a Schottky gate HFET, and is a circuit in which a forward direction diode and a reverse direction diode are cascade-connected to form a diode unit and two such diode units are connected in series, and a gate line connected to a gate electrode of the HFET is grounded through the protection circuit. The diodes are diodes formed integrally with the Schottky gate HFET which is protected against surge breakdown, and are constituted as Schottky barrier diodes made of an $n^+$-GaAs cap layer formed on a GaAs substrate and Schottky electrodes formed on the $n^+$-GaAs cap layer.

11 Claims, 6 Drawing Sheets

PROTECTION CIRCUIT OF FIELD EFFECT TRANSISTOR AND SEMICONDUCTOR DEVICE

RELATED APPLICATION DATA

The present invention claims priority to Japanese Application No. P2000-150350 filed May 22, 2000, which application is incorporated herein by reference to the extent permitted by law.

BACKGROUND OF THE INVENTION

1. Field of the Invention

The present invention relates to a protection circuit of a field effect transistor and a semiconductor device provided with the protection circuit, and particularly to a protection circuit of an FET for protecting a gate electrode or a drain electrode of the field effect transistor, especially a JFET, a MESFET, an HFET, or the like against surge breakdown, and for raising the surge resistance of the FET, in which a diode formed integrally with the FET is made a protection element in order to reduce the number of required process steps, and a semiconductor device provided with such a protection circuit.

2. Description of the Related Art

Since a field effect transistor of a compound semiconductor including a laminate structure of compound semiconductor layers of A GaAs system or the like has a high electron mobility and excellent high frequency characteristics, it is widely used in a field of a high frequency region, such as a portable telephone.

Now, it is known that the surge resistance of a gate electrode or a drain electrode of the compound semiconductor field effect transistor is not so high as to reach a level required for a field effect transistor of a desired use, structure or size.

Especially, in the compound semiconductor field effect transistor, such as a JFET, a MESFET, or an HFET, used for a power amplifier, a bias adjusting circuit of an antenna switch or the like and having a small gate width, for example, a gate width of 10 $\mu$m to 20 $\mu$m, the surge resistance of a gate electrode or a drain electrode is extremely low, and there is a case where the withstanding resistance of the gate electrode or the drain electrode is damaged by a surge voltage of 20 V to 30 V.

The JFET stands for a junction field effect transistor (JFET: Junction Field Effect Transistor) and is an element to perform current modulation by using a pn junction. The MESFET stands for Schottky barrier gate field effect transistor (MESFET: Metal-Semiconductor Field Effect Transistor) and is an element to perform current modulation by using a Schottky junction. The HFET stands for heterojunction field effect transistor (HFET: Heterojunction Field Effect Transistor) and is an element to perform current modulation by using a hetero junction.

Then, in order to raise the surge resistance and to protect the gate electrode of the FET from breakdown, a protection circuit including a protection element and protecting the FET is provided at the gate electrode of the FET.

Here, with reference to FIGS. 7A and 7B, a structure of a conventional protection circuit will be described. FIGS. 7A and 7B are circuit diagrams showing a protection circuit of a conventional example 1 and a protection circuit of conventional example 2, respectively.

A protection circuit 90 of the conventional example 1 is, as shown in FIG. 7A, a circuit in which Vgg connected to a gate electrode of an FET is grounded through a reverse direction diode 92, and Vgg is also connected to a drain electrode through a forward direction diode 94.

A protection circuit 96 of the conventional example 2 is, as shown in FIG. 7B, a circuit in which Vgg is grounded through a forward direction diode 98 and a reverse direction diode 99 cascade-connected thereto.

However, the above described conventional protection circuits have problems as described below, respectively.

In a field effect transistor such as a GaAs MESFET operated in a high frequency region, a ground line is made large, that is, the ground line is strengthened, so that lowering of high frequency characteristics, that is, lowering of gain in a high frequency region is prevented. However, in the protection circuit of the conventional example 1, as is understood from the structure shown in FIG. 7A, it becomes necessary to make terminals for bias adjustment, that is, a gate terminal and a drain terminal approach each other. As a result, there is a problem that to make the gate terminal and the drain terminal approach each other becomes a restriction to a pattern layout, and is not preferable in the pattern layout.

In the protection circuit of the conventional example 2, there is a problem that desired surge resistance can not be secured.

Meanwhile, in the case of a compound semiconductor FET in which a laminate structure of compound semiconductor layers is epitaxially grown on a compound semiconductor substrate, such a step of separately adjusting a channel concentration in order to form a protection element can not be carried out because of the process.

Thus, for example, when the surge resistance of an FET is made to be improved, a distance between a gate and a drain of the FET is set long so that the surge resistance is improved. Like this, in the compound semiconductor FET, there has been no method to improve the surge resistance except for a method of improving the surge resistance by adjusting the layout.

However, in recent years, as a withstand voltage between a gate and a drain of an FET becomes low, a distance between the gate and the drain becomes narrow, and for example, the distance between the gate and the drain is shortened so that it becomes a minimum dimension of design rules of layout.

In such a case, although it is necessary to further reduce a DC withstand voltage of a diode as a protection element, it becomes impossible to narrow a distance between junctions of the diode in the pattern layout.

On the other hand, although the DC withstand voltage can be made low by providing a Schottky electrode or a pn junction electrode in, for example, an $n^+$ region having a high doping concentration, that is, a high carrier concentration, there is a problem that a leak current is increased at the same time.

SUMMARY OF THE INVENTION

An object of the present invention is therefore to provide a protection circuit of a field effect transistor having a structure which can be fabricated without restricting the pattern layer of the field effect transistor and without increasing process steps.

The present inventor has considered that in order to achieve the above object, necessary conditions for a protection circuit of a field effect transistor, especially a protection circuit of a bias adjusting circuit are three conditions as follows:

(1) leak current of the protection circuit is low in a state where power supply voltage is applied,
(2) withstand voltage is lower than withstand voltage of a transistor or a diode provided at the first of the bias adjusting circuit, and
(3) surge resistance is high.

As a protection circuit of a field effect transistor satisfying the three conditions, the present inventor has conceived and studied a protection circuit in which a plurality of diode units of the same number, in each of which a forward direction diode and a reverse direction diode are made opposite to each other and are connected, are connected in series, and has attained the present invention.

In order to achieve the above object, a protection circuit of a field effect transistor according to the present invention is a protection circuit for protecting a gate electrode of the field effect transistor against surge breakdown, characterized in that the protection circuit includes a diode array in which a plurality of forward direction first diodes and reverse direction second diodes, the number of which is equal to that of the first diodes, are cascade-connected, and a gate electrode of the field effect transistor is grounded through the diode array.

In the present invention, the arrangement sequence of the first diodes and the second diodes in the diode array is arbitrary, and for example, the first diode and the second diode cascade-connected thereto constitute a pair, and a plurality of such pairs may be connected in series, or a diode array in which the plurality of first diodes are first cascade-connected may be connected in series to a diode array in which the second diodes, the number of which is equal to that of the first diodes, are cascade-connected.

In the present invention, although a leak current of each of the diodes is not small, the plurality of diodes, for example, two diodes are cascade-connected, so that a voltage applied to one diode becomes half of a voltage applied to a diode in the case where only one diode is provided as a protection element, and the leak current can be suppressed.

In the present invention, the number of the forward direction first diodes of the diode array is determined so that the leak current of the protection circuit becomes not larger than a leak current value of maximum rating of a gate electrode required for the field effect transistor. That is, the number of the forward direction first diodes may be at least the number determined as described above.

In other words, when the leak current value of maximum rating of the gate electrode is small, the number of the first diodes is increased, and to the contrary, when the leak current value of maximum rating of the gate electrode is large, the number of the first diodes is decreased.

Since the leak current of the protection circuit of the present invention becomes small, the consumed electric power of the whole circuit including the protection circuit can be suppressed.

In a preferred embodiment of the present invention, the diode of the diode array is formed as a Schottky electrode provided on an n-type region having a high doping concentration, or as an electrode forming a pn junction to an n-type region having a high doping concentration.

In a further preferred embodiment of the present invention, the field effect transistor is any one of a junction field effect transistor (JFET), a Schottky barrier gate field effect transistor (MESFET), and a hetero junction field effect transistor (HFET), and the diode is constructed as a compound semiconductor element formed integrally with the field effect transistor on a compound semiconductor substrate.

By this, the protection circuit of a bias adjusting circuit formed on an epitaxial substrate of a compound semiconductor layer can be formed without increasing process steps and without restricting the pattern layout of the bias adjusting circuit.

The protection circuit of the field effect transistor according to the present invention can be applied irrespectively of the kind of the field effect transistor.

Especially, it is optimum as a protection circuit of a compound semiconductor field effect transistor provided in a circuit, such as a portable telephone, a PHS, a power amplifier frequently used in an electronic instrument or the like mounted on a system using a high frequency, an antenna switch, a low noise amplifier, or a mixer.

Then, a semiconductor device of the present invention is a semiconductor device including a protection circuit for protecting a gate electrode or a drain electrode of a field effect transistor against surge breakdown, and is characterized in that the protection circuit includes a plurality of diodes connected to the gate electrode or the drain electrode in a forward direction, and a plurality of diodes connected to the gate electrode or the drain electrode in a reverse direction.

Besides, a semiconductor device of the present invention is a semiconductor device including a protection circuit for protecting a gate electrode of a field effect transistor against surge breakdown, and is characterized in that the protection circuit includes a first diode having an anode connected to the gate electrode, a second diode having a cathode connected a cathode of the first diode, a third diode having an anode connected to an anode of the second diode, and a fourth diode having a cathode connected to a cathode of the third diode.

Besides, a semiconductor device of the present invention is a semiconductor device including a protection circuit for protecting a gate electrode of a field effect transistor against surge breakdown, and is characterized in that the protection circuit includes a first diode having a cathode connected to the gate electrode, a second diode having an anode connected an anode of the first diode, a third diode having a cathode connected to a cathode of the second diode, and a fourth diode having an anode connected to an anode of the third diode.

Besides, a semiconductor device of the present invention is a semiconductor device including a protection circuit for protecting a gate electrode of a field effect transistor against surge breakdown, and is characterized in that the protection circuit includes a first diode unit made of a plurality of diodes in which a cathode or an anode is connected to the gate electrode, and a second diode unit made of a plurality of diodes in which an anode or a cathode is connected to the anode or the cathode of the first diode unit.

DETAILED DESCRIPTION OF THE PREFERRED EMBODIMENTS

Hereinafter, embodiments of the present invention will be described in detail with reference to the drawings.

Embodiment 1

Figure 1:
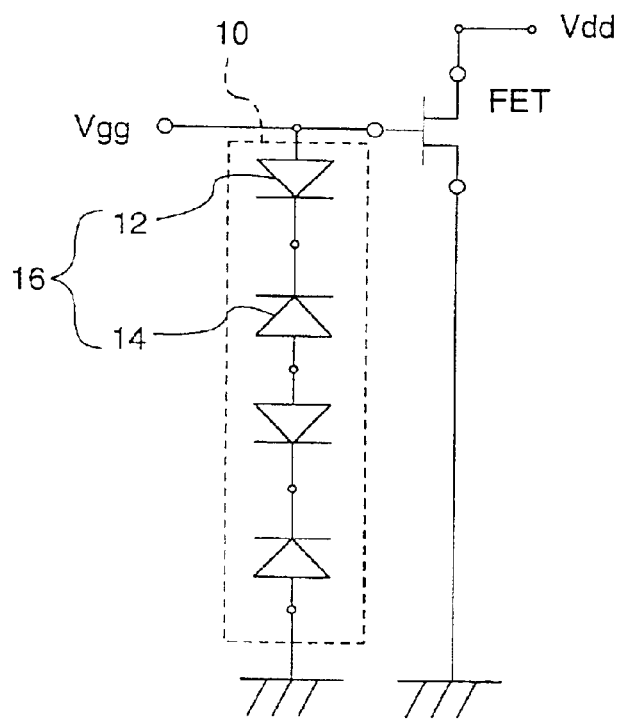
FIG. 1 is a circuit diagram of a protection circuit of a field effect transistor of an embodiment 1.
Figure 2:
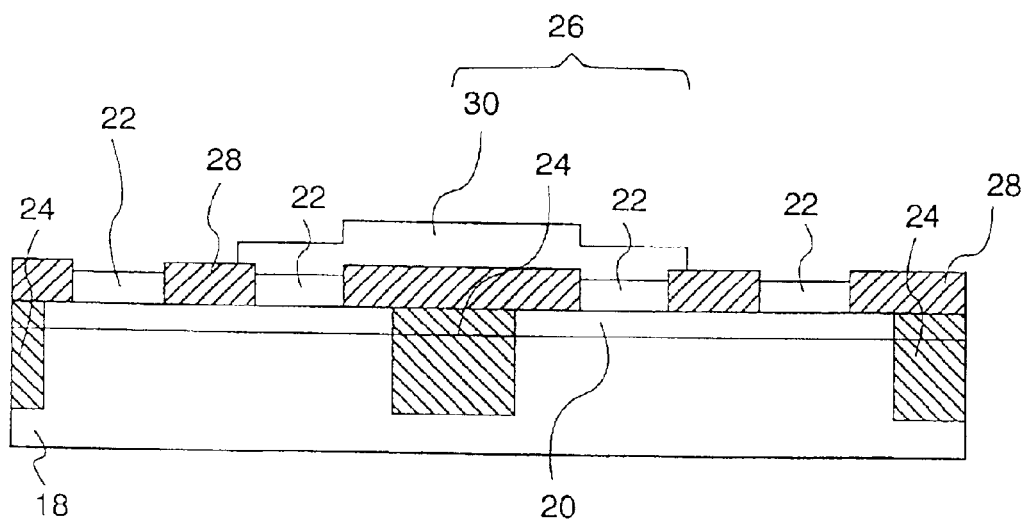
FIG. 2 is a sectional view showing a structure of a diode constituting the protection circuit.

This embodiment is an example of a protection circuit of a field effect transistor according to the present invention, FIG. 1 is a circuit diagram of a protection circuit of a field effect transistor of this embodiment, and FIG. 2 is a sectional view showing a structure of a diode constituting the protection circuit.

A protection circuit 10 of a field effect transistor of this embodiment is, as shown in FIG. 1, a protection circuit of a Schottky gate HFET provided in an MMIC (Monolithic Micro IC), and is a circuit in which a forward direction diode 12 and a reverse direction diode 14 cascade-connected thereto constitute a diode unit 16 and two such diode units 16 are connected in series. A gate line Vgg connected to a gate electrode of the HFET is grounded through the protection circuit 10.

The diodes 12 and 14 constituting the protection circuit 10 of this embodiment are diodes formed integrally with the Schottky gate HFET which the protection circuit 10 protects against surge breakdown, and as shown in FIG. 2, they are constituted as Schottky barrier diodes made of an n$^+$-GaAs cap layer 20 formed on a GaAs substrate 18 and Schottky electrodes 22 formed on the n$^+$-GaAs cap layer 20.

The n$^+$-GaAs cap layer 20 is provided in an element formation region 26 mutually separated by an isolation region (element separation region) 24, and is a layer having a high n-type doping concentration, that is, an n-type carrier concentration, desirably a carrier concentration of $2\times10^{18}$ cm$^{-3}$ or higher.

The Schottky electrode 22 is formed as a film of high melting metal such as WN (tungsten nitride) or a laminate metal film of Ti/Pt/Au or the like on the n$^+$GaAs cap layer 20, and is mutually insulated by an insulating film 28.

The Schottky electrodes 22 of the diode 12 and the diode 14 are mutually connected by a wiring line 30 made of a wiring material such as Au or Al.

In this embodiment, since each of the diodes 12 and 14 has a large leak current, these are connected in series into two stages. By connecting them into two stages, a voltage applied to one diode becomes half of a conventional one, and a leak current can be suppressed.

In order to fabricate the protection circuit 10 of this embodiment, in the same step as a step of fabricating the Schottky gate HFET constituting the MMIC, the n$^+$-GaAs cap layer 20 is epitaxially grown on the GaAs substrate 18, and next, the element formation regions 26 are mutually separated by the isolation region 24.

Next, the Schottky electrode 22 is formed using the same metal material as the gate electrode of the Schottky gate HFET by a sputtering method or like on the n$^+$-GaAs cap layer 20 without etching the grown n$^+$-GaAs cap layer 20.

As the electrode material, for example, a high melting metal such as WN (tungsten nitride) may be deposited by a sputtering method, or a laminate metal film of Ti/Pt/Au or the like may be formed by an electron gun evaporation method (e-gun evaporation method).

Next, the Schottky electrodes 22 are connected to each other by the wiring line 30 made of a wiring material such as Au or Al.

By this, since the protection circuit 10 can be fabricated by the same process step as the formation of the HFET which the protection circuit 10 protects against surge breakdown, the protection circuit 10 can be formed without increasing a process step and without restricting the pattern layout of the HFET.

Embodiment 2

Figure 3:
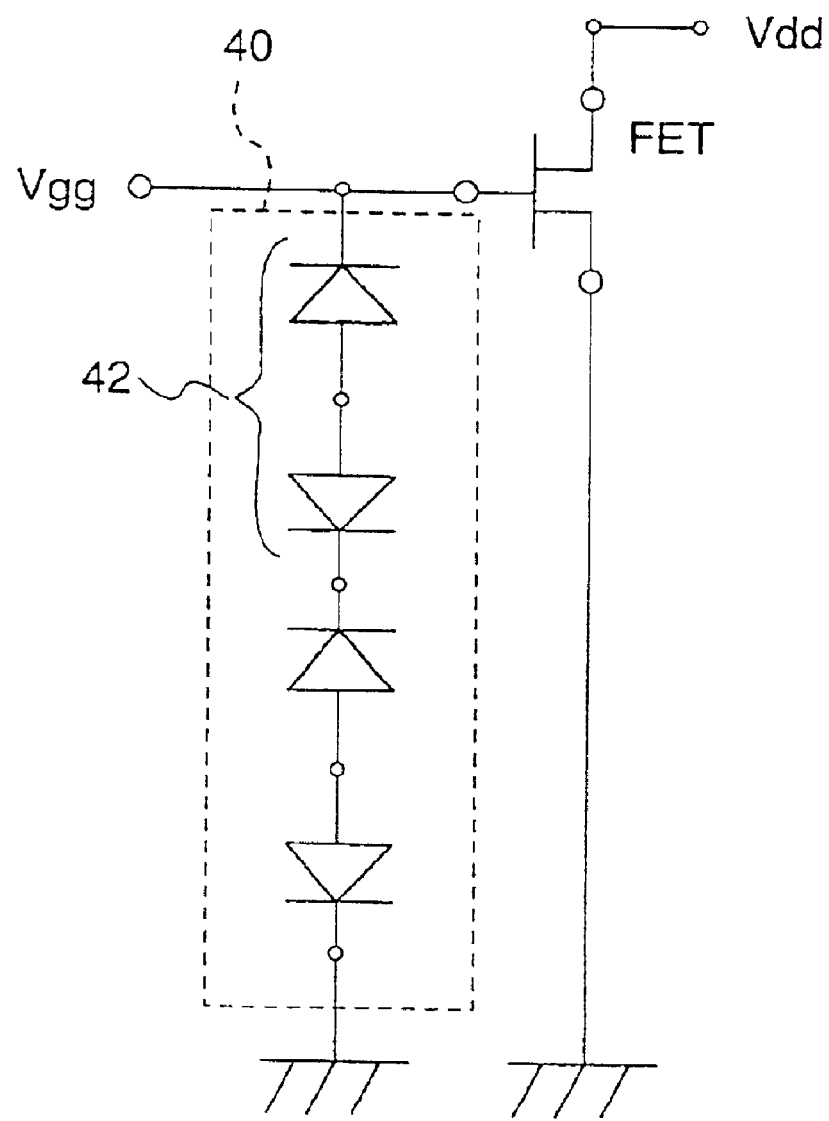
FIG. 3 is a circuit diagram of a protection circuit of a field effect transistor of an embodiment 2.

This embodiment is another example of a protection circuit of a field effect transistor according to the present invention, and FIG. 3 is a circuit diagram of a protection circuit of a field effect transistor of this embodiment.

A protection circuit 40 of a field effect transistor of this embodiment is a protection circuit having a pn junction diode as a protection element, and as shown in FIG. 3, it is a protection circuit of an FET in which npn diodes 42 each including an np junction and a pn junction are connected in series into two stages. A gate line Vgg connected to a gate electrode of the FET is grounded through the protection circuit 40.

Also in this embodiment, the carrier concentration of an n-type layer of the np junction is preferably made $2\times10^{18}$ cm$^{-3}$ or higher.

MODIFIED EXAMPLE 1 OF EMBODIMENT 2

Figure 4:
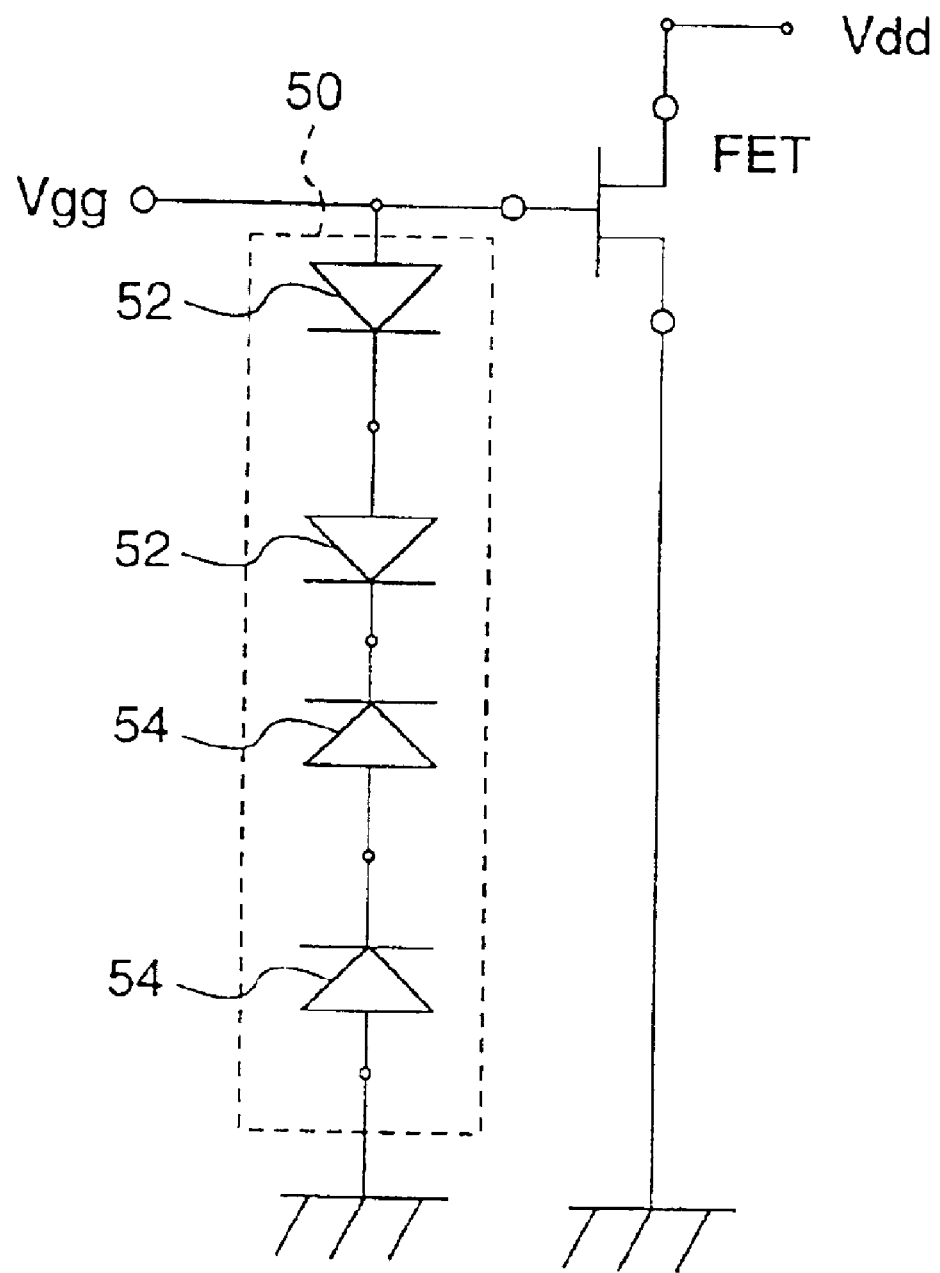
FIG. 4 is a circuit diagram of a protection circuit of a field effect transistor of a modified example 1 of the embodiment 2.

This modified example is a modified example of the embodiment 2, and FIG. 4 is a circuit diagram of a protection circuit of a field effect transistor of this modified example.

A protection circuit 50 of a field effect transistor of this modified example is, as shown in FIG. 4, a protection circuit of an FET in which a diode array including two cascade-connected pn junction diodes 52 and a diode array including two cascade-connected np junction diodes 54 are connected in series, and a gate line Vgg connected to a gate electrode of the FET is grounded through the protection circuit 50.

Also in this modified example, the carrier concentration of an n-type layer of the np junction is preferably made $2\times10^{18}$ cm$^{-3}$ or higher.

MODIFIED EXAMPLE 2 OF EMBODIMENT 2

Figure 5:
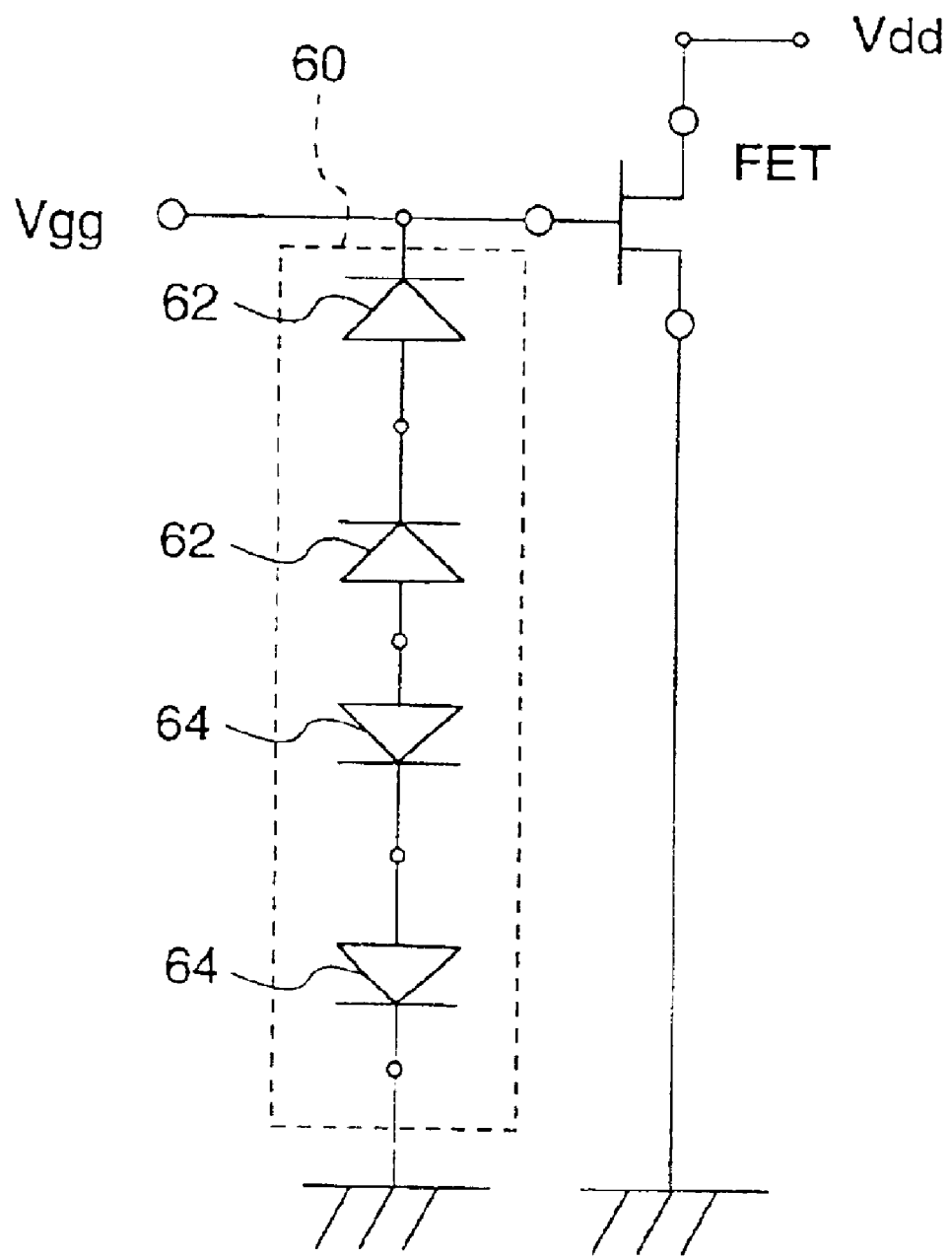
FIG. 5 is a circuit diagram of a protection circuit of a field effect transistor of a modified example 2 of the embodiment 2.

This modified example is another modified example of the embodiment 2, and FIG. 5 is a circuit diagram of a protection circuit of a field effect transistor of this modified example.

In a protection circuit 60 of a field effect transistor of this modified example, the arrangement of forward direction diodes and reverse direction diodes is opposite to the protection circuit 50 of the modified example 1, and as shown in FIG. 5, it is a protection circuit of an FET in which a diode array including two cascade-connected reverse direction np junction diodes 62 and a diode array including two cascade-connected forward direction pn junction diodes 64 are connected in series. A gate line Vgg connected to a gate electrode of the FET is grounded through the protection circuit 60.

Also in this modified example, the carrier concentration of an n-type layer of the np junction is preferably made $2\times10^{18}$ cm$^{-3}$ or higher.

Embodiment 3

This embodiment is a protection circuit in which a pn junction diode is made a protection element, instead of the Schottky barrier diode of the embodiment 1.

Figure 6:
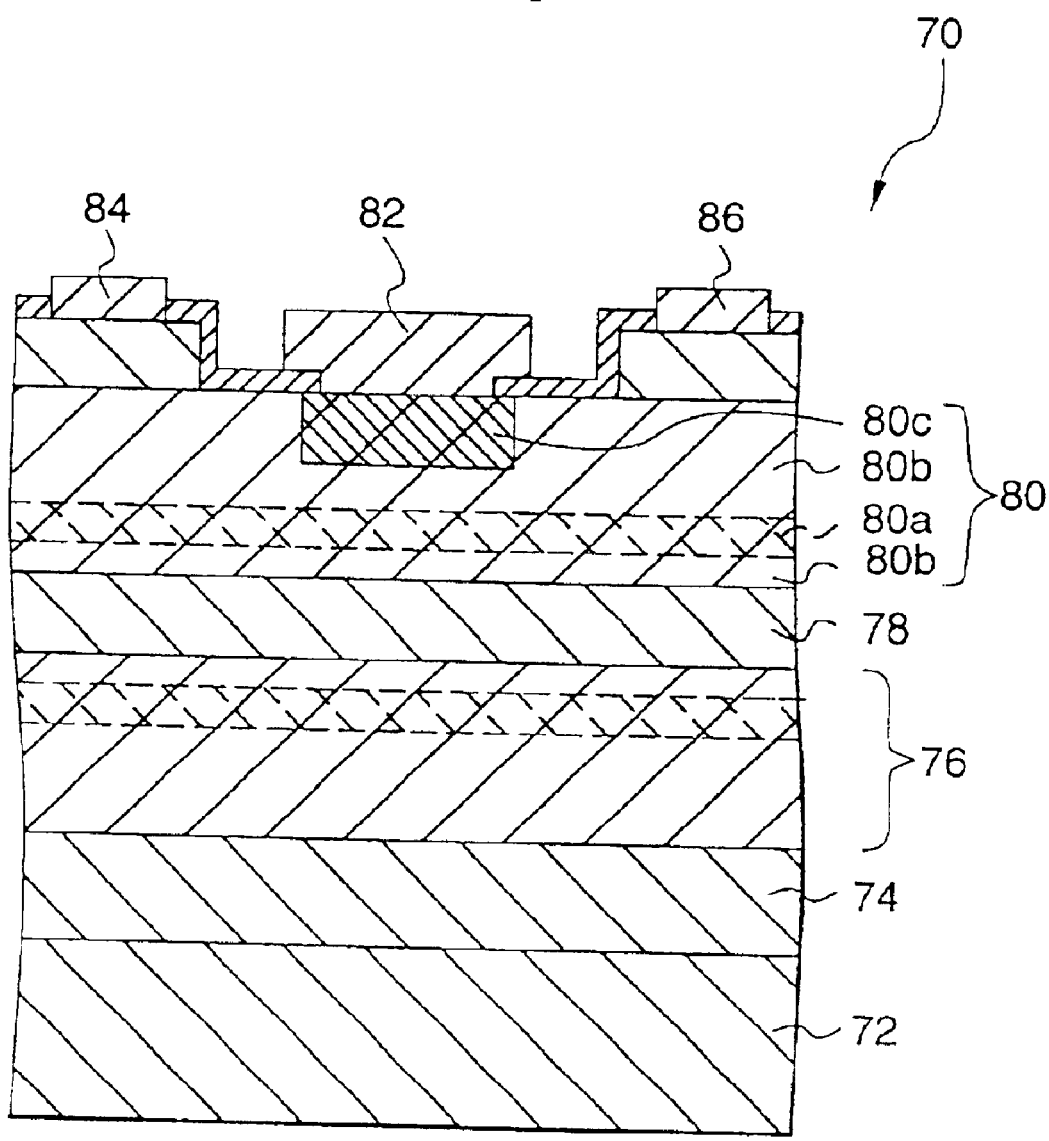
FIG. 6 is a sectional view showing a structure of an HFET.
Figure 7A:
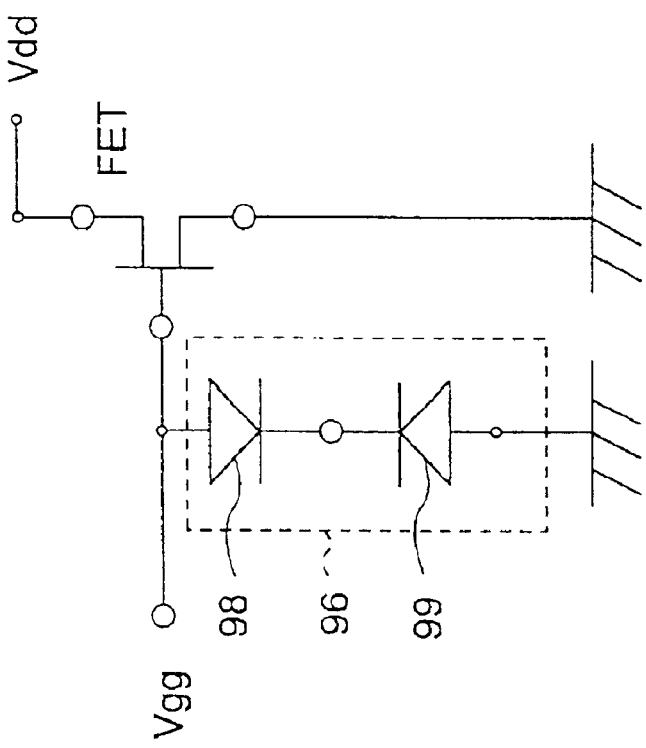
FIGS. 7A and 7B are circuit diagrams of protection circuits of a conventional example 1 and a conventional example 2, respectively.
Figure 7B:
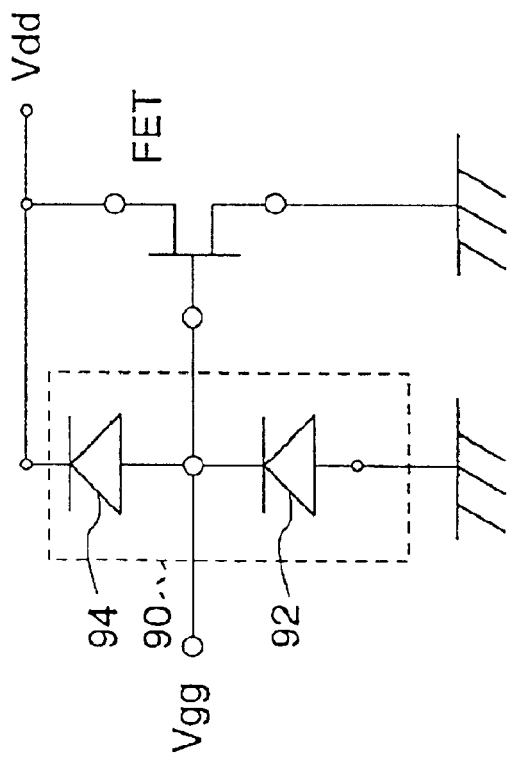

Incidentally, as an FET (HFET) including a hetero junction, there is a device as disclosed in, for example, Japanese Patent Unexamined Publication No. Hei. 11-150264 (Japanese Patent Application No. Hei. 9-249217). Here, a structure of the HFET disclosed in the publication will be described with reference to FIG. 6. FIG. 6 is a sectional view showing the structure of the HFET.

An HFET 70 of this embodiment includes, as shown in FIG. 6, a laminate structure of a buffer layer 74, a second barrier layer 76 made of AlGaAs, a channel layer 78 made of InGaAs, and a first barrier layer 80 made of AlGaAs, sequentially formed on a GaAs substrate 72.

The first barrier layer 80 is constituted by a carrier supply region 80a containing an n-type impurity, a high resistance region 80b containing no impurity, and a p-type low resistance region 80c containing a p-type impurity. The p-type low resistance region 80c is formed by diffusion of an impurity to be in contact with a gate electrode 82 embedded in the high resistance region 80b.

In FIG. 6, reference numerals 84 and 86 designate a source electrode and a drain electrode, respectively.

The foregoing HFET 70 includes the structure 80c in which the p-type impurity is diffused in the n$^+$ layer 80b. The diffusion depth of the p-type impurity may be larger than the thickness of the n$^+$ layer 80b or less than the n$^+$ layer.

In this embodiment, the pn junction diode is constituted by the n$^+$ layer 80b and the p-type low resistance region 80c.

In this embodiment, the protection circuit can also be used as an input terminal of RF. In this case, since a sufficient DC withstand voltage is needed also in the reverse direction, a diode is cascade-connected also in the reverse direction in series.

A semiconductor device of the present invention is a semiconductor device including the protection circuit of the foregoing embodiments 1 to 3 including the modified examples.

According to the present invention, there is provided a diode array in which a plurality of forward direction first diodes and reverse direction second diodes, the number of which is equal to that of the first diodes, are connected in series, and a gate electrode of a field effect transistor is grounded through the diode array, so that a protection circuit of the field effect transistor can be formed without restricting the pattern layout of the field effect transistor. Besides, since a leak current of the protection circuit of the present invention is small as compared with the prior art, the consumed electric power of the whole field effect transistor including the protection circuit can be suppressed.

Besides, the protection circuit of the present invention is constructed as a compound semiconductor element formed integrally with a field effect transistor on an epitaxial substrate of compound semiconductor, and the protection circuit can be formed at the same time as the formation of the field effect transistor which the protection circuit protects against surge breakdown, so that a process step is not additionally required in order to form the protection circuit.

What is claimed is:

1. A protection circuit of a hetero-junction field effect transistor for protecting a gate electrode of the hetero-junction field effect transistor against surge breakdown, comprising:

a Schottky barrier diode array having a plurality of forward direction first diodes and reverse direction second diodes, the number of second diodes being equal to that of the first diodes, are cascade-connected, wherein a gate electrode of the hetero-junction field effect transistor is grounded through the Schottky barrier diode array.

2. A protection circuit of a hetero-junction field effect transistor according to claim 1, wherein each diode of the diode array is formed as a Schottky barrier diode made of an n+-type layer having a high doping concentration and a Schottky electrode provided on the n+-type layer.

3. A protection circuit of a hetero-junction field effect transistor according to claim 1, wherein the number of the forward direction first diodes of the Schottky diode array is determined so that a leak current of the protection circuit becomes not larger than a leak current value of a maximum rating of the gate electrode of the hetero-junction field effect transistor.

4. A protection circuit of a hetero-junction field effect transistor according to claim 1, wherein the Schottky barrier diode is constructed as a compound semiconductor element formed integrally with the transistor.

5. A semiconductor device comprising a protection circuit for protecting a gate electrode or a drain electrode of a hetero-junction field effect transistor against surge breakdown, wherein the protection circuit includes a series connection of a plurality of Schottky barrier diodes, and a plurality of reverse Schottky barrier diodes.

6. A semiconductor device according to claim 5, wherein the semiconductor device is formed on a compound semiconductor substrate.

7. A semiconductor device according to claim 6, wherein the compound semiconductor substrate is made of GaAs.

8. A semiconductor device according to claim 5, wherein the diode includes a first impurity introduction layer formed in a substrate, and a Schottky electrode formed on the first impurity introduction layer and being Schottky-connected to the first impurity introduction layer.

9. A semiconductor device according to claim 5, wherein the diode includes a first conductivity type first impurity introduction layer and a second conductivity type second impurity introduction layer provided opposite to the first impurity introduction layer.

10. A semiconductor device comprising a protection circuit for protecting a gate electrode of a hetero-junction field effect transistor against surge breakdown, wherein the protection circuit includes a first Schottky barrier diode having an anode connected to the gate electrode, a second Schottky barrier diode having a cathode connected to the cathode of the first diode, a third Schottky barrier diode having an anode connected to the anode of the second diode, and a fourth Schottky barrier diode having a cathode connected to the cathode of the third diode.

11. A semiconductor device comprising a protection circuit for protecting a gate electrode of a hetero-junction field effect transistor against surge breakdown, wherein the protection circuit includes a first Schottky barrier diode having a cathode connected to the gate electrode, a second Schottky barrier diode having an anode connected the anode of the first diode, a third Schottky barrier diode having a cathode connected to the cathode of the second diode, and a fourth Schottky barrier diode having an anode connected to the anode of the third diode.

* * * * *